United States Patent
Ghiasi (10) Patent No.: US 10,866,376 B1
(45) Date of Patent: Dec. 15, 2020

(54) METHOD AND SYSTEM FOR CO-PACKAGING PHOTONICS INTEGRATED CIRCUIT WITH AN APPLICATION SPECIFIC INTEGRATED CIRCUIT

(71) Applicant: Ali Ghiasi, Cupertino, CA (US)

(72) Inventor: Ali Ghiasi, Cupertino, CA (US)

(73) Assignee: Ali Ghiasi

( * ) Notice: Subject to any disclaimer, the term of this patent is extended or adjusted under 35 U.S.C. 154(b) by 0 days.

(21) Appl. No.: 16/453,873

(22) Filed: Jun. 26, 2019

(51) Int. Cl.
*G02B 6/42* (2006.01)
*H01L 23/00* (2006.01)
(Continued)

(52) U.S. Cl.
CPC ........... *G02B 6/4284* (2013.01); *G02B 6/425* (2013.01); *G02B 6/4246* (2013.01); *G02B 6/4272* (2013.01); *G02B 6/4292* (2013.01); *G02B 6/43* (2013.01); *H01L 24/04* (2013.01); *H01L 24/13* (2013.01); *H01L 24/14* (2013.01);
(Continued)

(58) Field of Classification Search
CPC .... G02B 6/4284; G02B 6/4201; G02B 6/425; G02B 6/4246; G02B 6/4272; G02B 6/4286; G02B 6/4292; G02B 6/4295; G02B 6/4296; G02B 6/43; H01L 24/04; H01L 24/13; H01L 24/14; H01L 24/16; H01L 24/17; H01L 2224/0401; H01L 2224/1403; H01L 2224/16227; H01L 2224/1703; H01L 2224/16135; H01L 2224/16141; H01L 2224/16145; H01L 2924/35;
(Continued)

(56) References Cited

U.S. PATENT DOCUMENTS

6,122,747 A * 9/2000 Krening ................ G06F 13/385
326/39
7,418,163 B2 * 8/2008 Chakravorty ............ G02B 6/42
385/129
(Continued)

*Primary Examiner* — Michael P Mooney (57) ABSTRACT

A method and system of co-packaging optoelectronics components or photonic integrated circuit (PIC) with application specific integrated circuits (ASICs) are disclosed and may include package substrate, several electronics die, passive components, socket assembly, and heat sinks. The said method converts ASIC high speed signals to optical signals by eliminating intermediary electrical interface between the ASIC and conventional optical modules. The method described provides many advantages of pluggable optical modules such as configurability, serviceability, and thermal isolation from the ASIC heat, while eliminating bandwidth bottlenecks as result of the ASIC package, host or linecard printed circuit board (PCB) traces, and the optical module connector. The high-power consumption ASIC is mounted below the package substrate, but sensitive optoelectronics and PIC components are mounted on top of the package substrate assembly for thermal isolation and serviceability. The package assembly ball grid array (BGA) or pin grid array (PGA) contacts are on the same side of the package substrate surface as ASIC die. The co-packaged package assembly is attached to the host or linecard PCB having a cutout for ASIC with the heatsink mounted from the bottom onto the ASIC die.

17 Claims, 12 Drawing Sheets (51) Int. Cl.
  *H04B 10/40*   (2013.01)
  *G02B 6/43*   (2006.01)
  *H04B 10/516*  (2013.01)
  *H04B 10/25*   (2013.01)

(52) U.S. Cl.
  CPC .............. *H01L 24/16* (2013.01); *H01L 24/17* (2013.01); *H04B 10/40* (2013.01); *H01L 2224/0401* (2013.01); *H01L 2224/1403* (2013.01); *H01L 2224/16227* (2013.01); *H01L 2224/1703* (2013.01); *H04B 10/25* (2013.01); *H04B 10/516* (2013.01)

(58) Field of Classification Search
  CPC . H01L 2924/351; H04B 10/25; H04B 10/516; H04B 10/40; H01S 5/0228; H01S 5/0261
  USPC ................................................ 385/14, 88–94
  See application file for complete search history.

(56) References Cited

U.S. PATENT DOCUMENTS

| | | | |
|---|---|---|---|
| 9,557,478 B2* | 1/2017 | Doerr | G02B 6/43 |
| 2014/0177625 A1* | 6/2014 | Chang | H01L 23/5381 |
| | | | 370/351 |

\* cited by examiner

METHOD AND SYSTEM FOR CO-PACKAGING PHOTONICS INTEGRATED CIRCUIT WITH AN APPLICATION SPECIFIC INTEGRATED CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

STATEMENT REGARDING PRIOR DISCLOSURES BY THE INVENTOR OR A JOINT INVENTOR

Not applicable.

BACKGROUND OF THE INVENTION

Field of the Invention

Int. Cl.
G02B 6/13 (2018 November)
G02B 6/43 (2018 November)
G02B 6/43 (2018 November)
H01S 5/024 (2018 November)
U.S. Cl.
CPC . . . G02B 6/428 (2019 May); G02B 6/4284 (2019 May); G02B 6/4269 (2019 May); G02B 6/43 (2019 May); G02B 6/13 (2019 May); H01S 5/024 (2019 May); H01S/524 (2019 May); H04B 10/801 (2019 May)

Description of Related Art

The following is a tabulation of some prior arts that presently appears relevant:

| U.S. Pat. | | | |
|---|---|---|---|
| Pat. No. | Kind Code | Issue Date | Patentee |
| 7,344,383 | B1 | Mar. 18, 2008 | Daoqiang Lu |
| 10,242,979 | B2 | Mar. 26, 2019 | Myung Jin Yim |
| 9,910,232 | B2 | Mar. 6, 2018 | Attila Mekis |
| 9,297,971 | B2 | Mar. 29, 2016 | Hiren D. Thacker |
| 7,544,527 | B2 | Jun. 9, 2009 | Allan F. Benner |

| U.S. Pat. application | | | |
|---|---|---|---|
| Pat. No. | Kind Code | Issue Date | Patentee |
| 0,196,196 | A1 | Jul. 12, 2018 | Gerald Cois Byrd |
| 0,274,316 | A1 | Sep. 22, 2016 | Jean-Marc Andre Verdiell |
| 0,270,784 | A1 | Sep. 18, 2014 | Hiren D. Thacker |

The following U.S. Pat. No. 7,344,383 (2008), U.S. Pat. No. 10,242,979 (2019), U.S. Pat. No. 9,910,232 (2018), U.S. Pat. No. 9,297,971 (2016), and U.S. Pat. No. 7,544,527 (2009) as well as the following U.S. patent application Ser. No. 0196196 (2018) and Ser. No. 0270784 (2014) are related to the field of co-packaging opto-electronics devices with conventional Application Specific Integrated Circuits (ASICs). The above patents and patent applications are using conventional ASIC packages or interposers, where thermal sensitive opto-electronic devices are mounted on the same substrate face and next to the high-power ASICs resulting in opto-electronics devices aging and failure over time. The embodied patents and patents' applications co-package opto-electronic devices permanently on the same ASIC substrate, where repair and serviceability are not feasible. US patent application Ser. No. 0274316 by using an integrated circuit (IC) socket is potentially serviceable but the IC is placed on top of the opto-electronics devices will results in thermal degradation and aging due to heat generated by the ASIC.

BACKGROUND

With the ever increasing of the network speed the conventional pluggable optics modules may limit the aggregate bandwidth flowing through network switches. Conventional pluggable optics are connected with a copper interconnect based on printed circuit board (PCB) and ball grid array (BGA) package to the application specific integrated circuits (ASIC) switch. Increasing signaling rate or the use of higher order modulations are some of the options to improve bandwidth bottleneck between ASIC and pluggable optics modules but increasing the signaling rate will dramatically increase PCB trace loss and higher order modulations requires more complex digital signal processing (DSP) with significant added power.

Optics co-packaged with an application specific integrated circuits (ASIC) is viewed as the ultimate solution to eliminate copper interconnect (PCB or copper cable) bottlenecks between multi-Terabit ASIC and pluggable optics modules, but prior embodiments have not addressed manufacturability, serviceability, or thermal issues. With ever increasing signaling rate copper interconnect that carries the data between the ASIC and pluggable optics module is becoming a bottleneck. The industry needs a manufacturable and serviceable co-packaged optics solution, where the essential but simplified function of an optical module is integrated on the same package substrate with the ASIC. The limitations of current co-packaged optics will become apparent to one of skill in the art, through comparisons with embodiment of this disclosure. Today and for the foreseeable future, opto-electronics devices and photonic integrated circuit (PIC) require complex manufacturing with in field replacement and upgrade where this embodiment provides.

BRIEF SUMMARY OF THE INVENTION

A system and/or method of assembling application specific integrated circuits (ASIC) dies on an inverted package substrate assembly with optoelectronic devices and Photonics Integrated Circuits (PIC) as shown in and/or described in connection with at least one of the figures and sets forth more completely in the claims.

Novel features and advantages of present invention, as well as details of an illustrated embodiment thereof, will be more fully understood from the following description and drawings.

DETAILED DESCRIPTION OF THE INVENTION

Present embodiment enhances application specific integrated circuits (ASIC) packages to allow assembly and co-packaging optoelectronics or photonic integrated circuits (PIC). Certain aspects of the disclosure may be found in the method and system of chip-scale and chiplet assembly. This embodiment supports high power ASICs, field programmable gate arrays (FPGAs), graphic processor units (GPUs), or processors co-packaged with thermally sensitive optoelectronics components or PICs. The embodiment allows co-packaging high power ASIC devices with thermally sensitive optoelectronics PICs by mounting the ASIC on the bottom of the substrate on the same side as ball grid array (BGA) or pin grid array (PGA) contacts and mounting optoelectronics components or PICs on the substrate top surface and thermally isolating them from heat generated by the ASIC. By mounting the ASIC on the same side as the package BGA or PGA contacts, the full top surface of the package assembly is available to mount thermally sensitive optoelectronics components or PICs. By mounting optoelectronics components or PICs on opposite side of the ASIC, it forms a 3D assembly, thereby reducing package substrate electrical trace lengths.

Co-packaging efficient high-speed optoelectronics or photonics integrated circuits (PICs) can eliminate application specific integrated circuits (ASIC) bandwidth bottlenecks due to package ball grid array (BGA), printed circuit boards (PCBs), and connectors necessary in case of pluggable optical module embodiment. To meet network capacity requirements, the IO speed and/or number of IO must double every 3 years. Increasing IO speeds require more complex higher order modulations and increasing the number of IO requires larger more complex non-organic ceramic ASIC substrate. This embodiment provides a reliable manufacturable method to co-package optoelectronics or PICs with standard ASIC dies on the same substrate. The embodiment is mounted on the host PCB with a cutout for the ASIC and package stiffener to pass through, then the co-packaged assembly is attached to the host PCB either with standard BGA reflow or inserted into the host or linecard PCB with pin grid array (PGA).

Figure 1A:
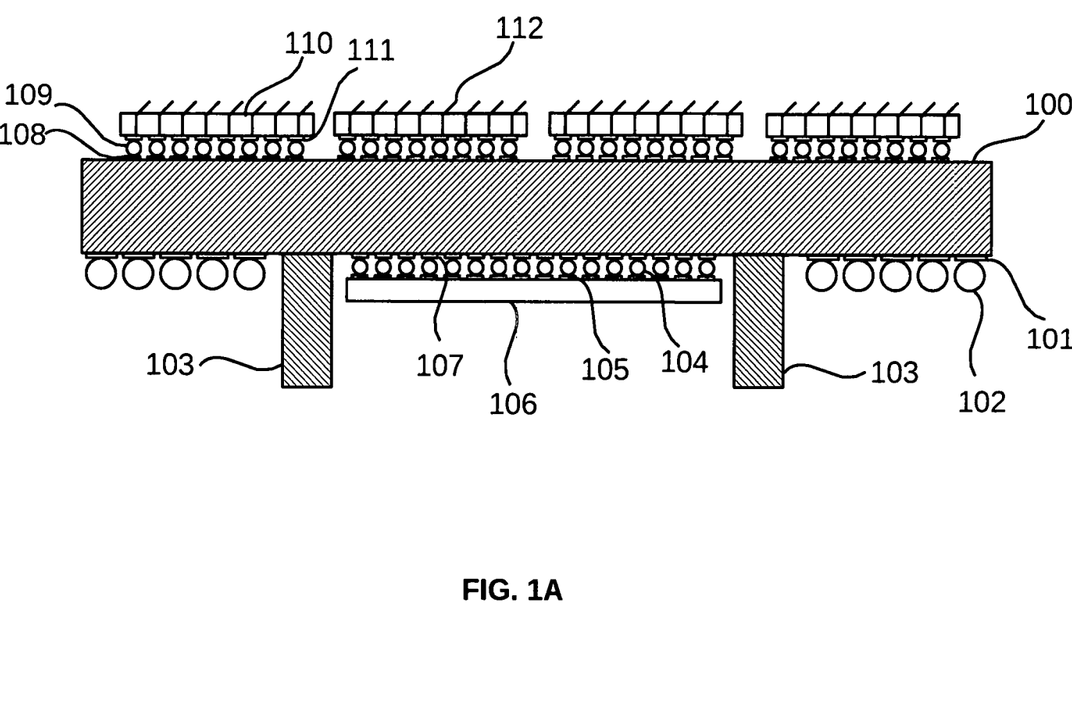
FIG. 1A is the co-packaged substrate assembly with BGA pads, ASIC, and socket assembly, in accordance with the embodiment of the disclosure.

FIG. 1A is a partial cross section view of the embodiment package assembly 100 for a networking or a computer system depicted to have an application specific integrated circuit (ASIC) chip 106, the ASIC chip having metal contacts 105 and micro-bumps or copper-pillars 104 attached to substrate metal contacts 107, substrate contacts 101 and BGA contacts 102 provide connection to the host or linecard printed circuit board PCB, stiffener 103 provide mechanical stability for mounting the heat sink, ball grid array (BGA) or land grid array (LGA) socket 110 having pin contact 112 provides a serviceable interface for inserting or replacing an optoelectronic device or photonic integrated circuit (PIC) having socket 110, BGA socket 109 attaches the to pad contacts 108 on top of the package substrate. ASIC 106 may also be attached to the package assembly substrate 100 with ceramic ball grid array (CBGA) or land grid array (LGA). The embodiment substrate assembly 100 may also include passive components or other auxiliary integrated circuits such as DC-DC convertors, low drop out regulators, microcontrollers, EEPROM, or SRAM.

Figure 1B:
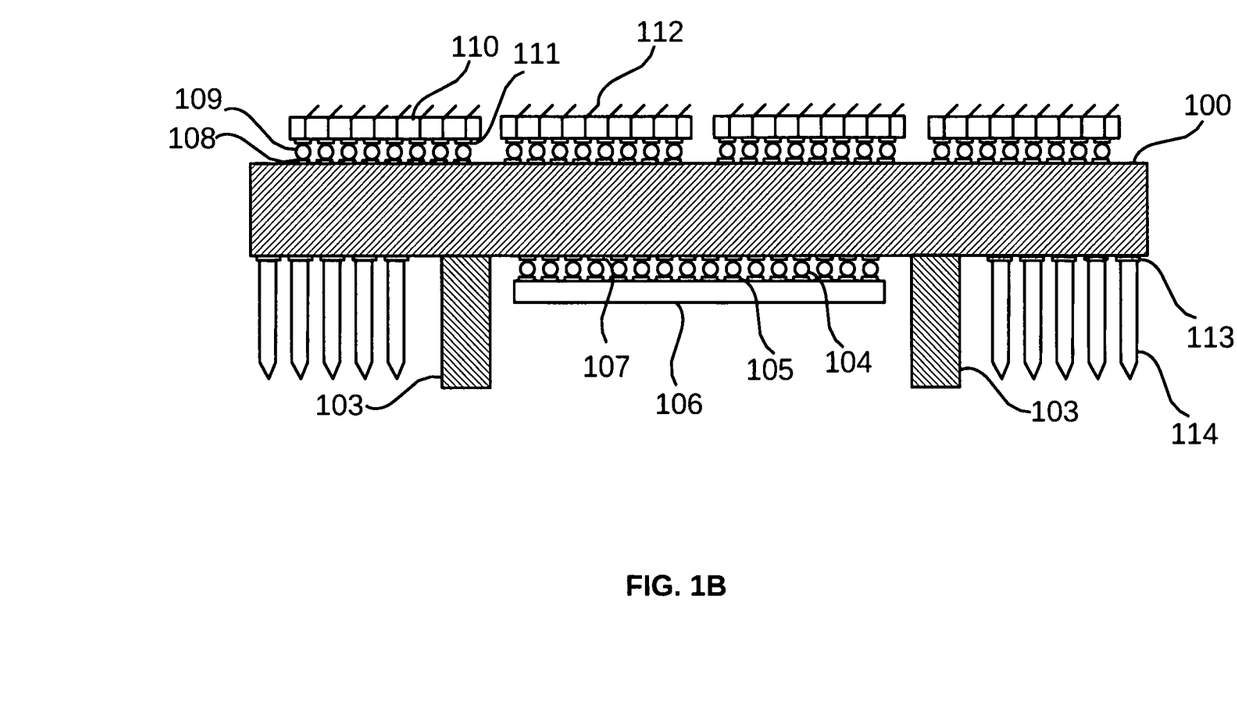
FIG. 1B is the co-packaged substrate assembly with PGA pins, ASIC, and socket assembly, in accordance with the embodiment of the disclosure.

FIG. 1B is an alternate embodiment of FIG. 1A, showing a partial cross section view where the package assembly 100 with pin grid array (PGA) metal pads 113 and PGA pins 114 instead of ball grid array (BGA) contacts 102 for attachment to the host or line card printed circuit board (PCB), stiffener 103 provide mechanical stability for mounting the heat sink, BGA or LGA socket 110 having pin contacts 112 that provides a serviceable interface for inserting or replacing optoelectronic device or photonic integrated circuit (PIC), BGA 108 attaches the socket 110 to pad contacts 109 on top of the package substrate.

Figure 1C:
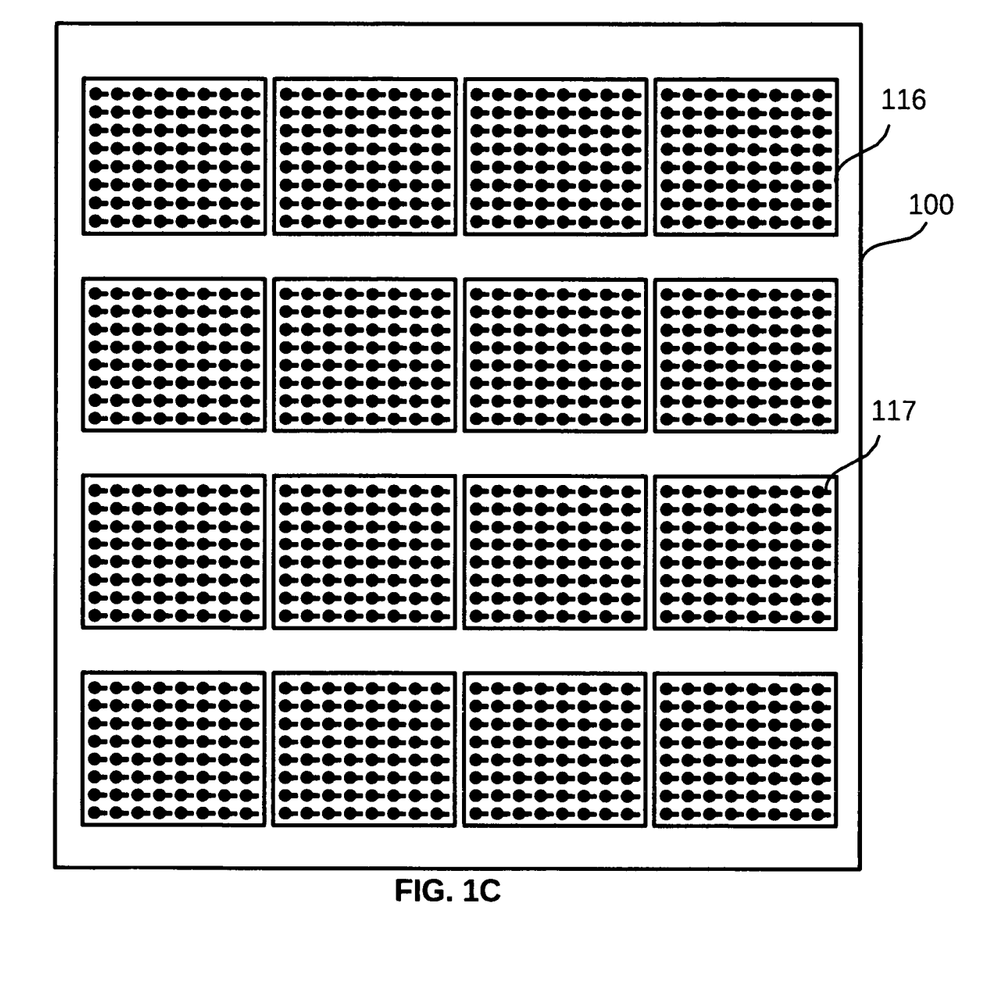
FIG. 1C is the co-packaged substrate assembly with 4×4 socket assembly, in accordance with the embodiment of the disclosure.

FIG. 1C is the top view of the embodiment 100 depicted having a matrix of 4×4 (16 total) sockets assemblies 116, each socket assembly has sufficient pins 117 to support input/output (IO) function of the optoelectronic devices or photonic integrated circuit (PIC), power, ground, and management. Each socket assembly 116 mounted on the package substrate assembly 100. Alternate embodiments may consist of fewer or more socket assemblies 116 instead of 16 socket assemblies.

Figure 1D:
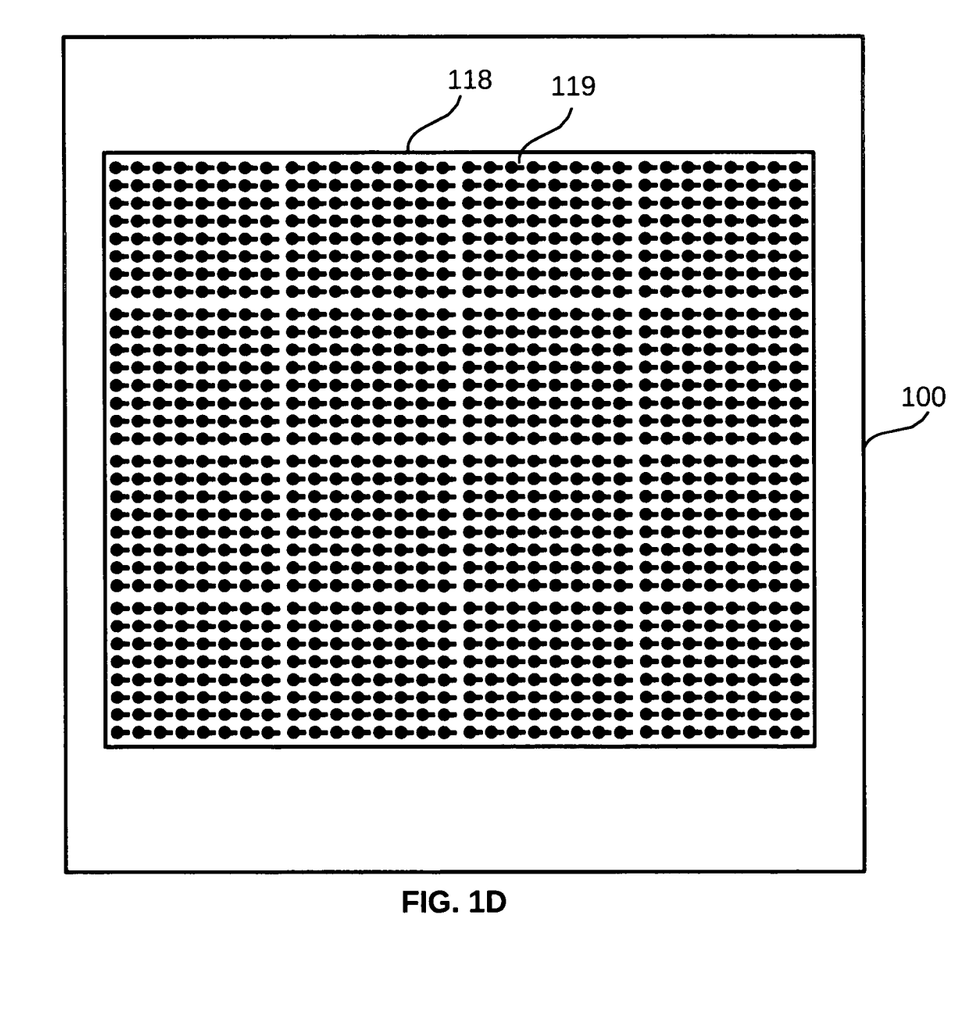
FIG. 1D is the co-packaged substrate assembly with single large socket assembly, in accordance with the embodiment of the disclosure.

FIG. 1D is the top view of the embodiment depicted having one large sockets assembly 118 with socket pins 119 mounted on the package substrate assembly 100.

Figure 1E:
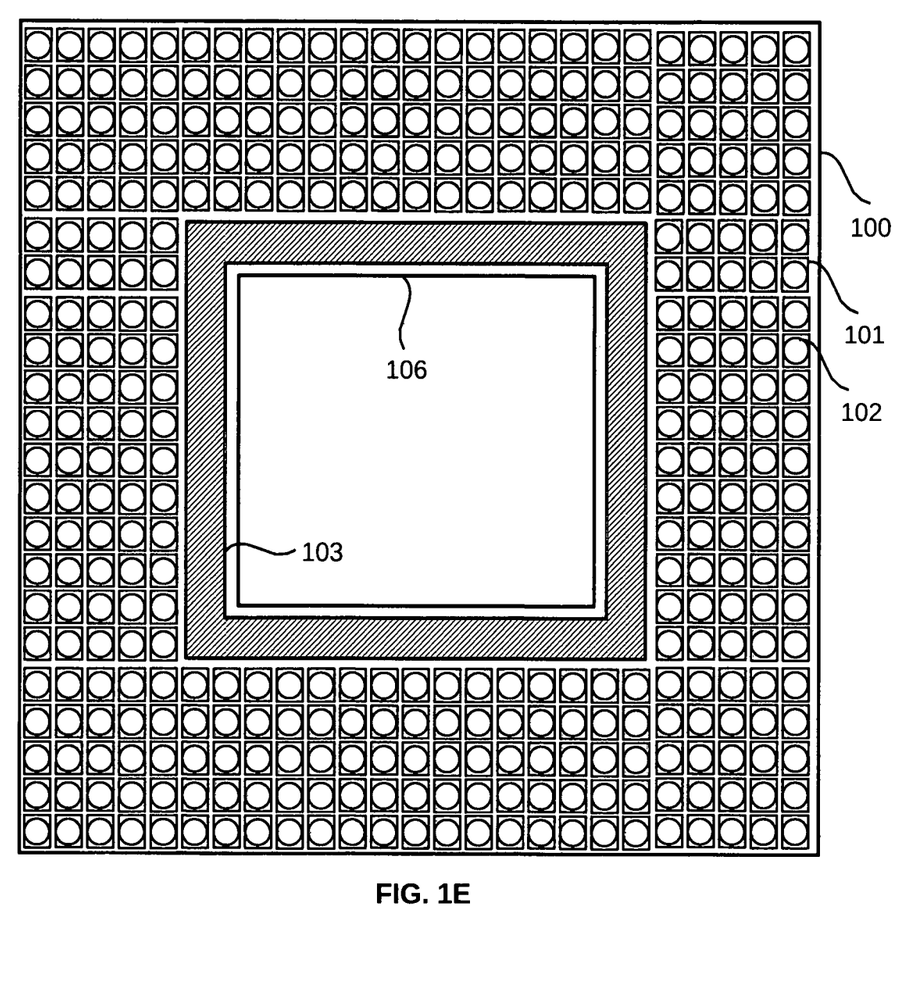
FIG. 1E is the co-packaged substrate assembly from ASIC view with BGA or PGA contacts, in accordance with the embodiment of the disclosure.

FIG. 1E is the bottom view of the co-packaged substrate assembly depicted having application specific integrated circuit (ASIC) 106, stiffener 103, ball grid array (BGA) contacts 102, BGA pads 101. Alternate embodiment may use pin grid array (PGA) pads 113 and PGA pins 114.

Figure 2A:
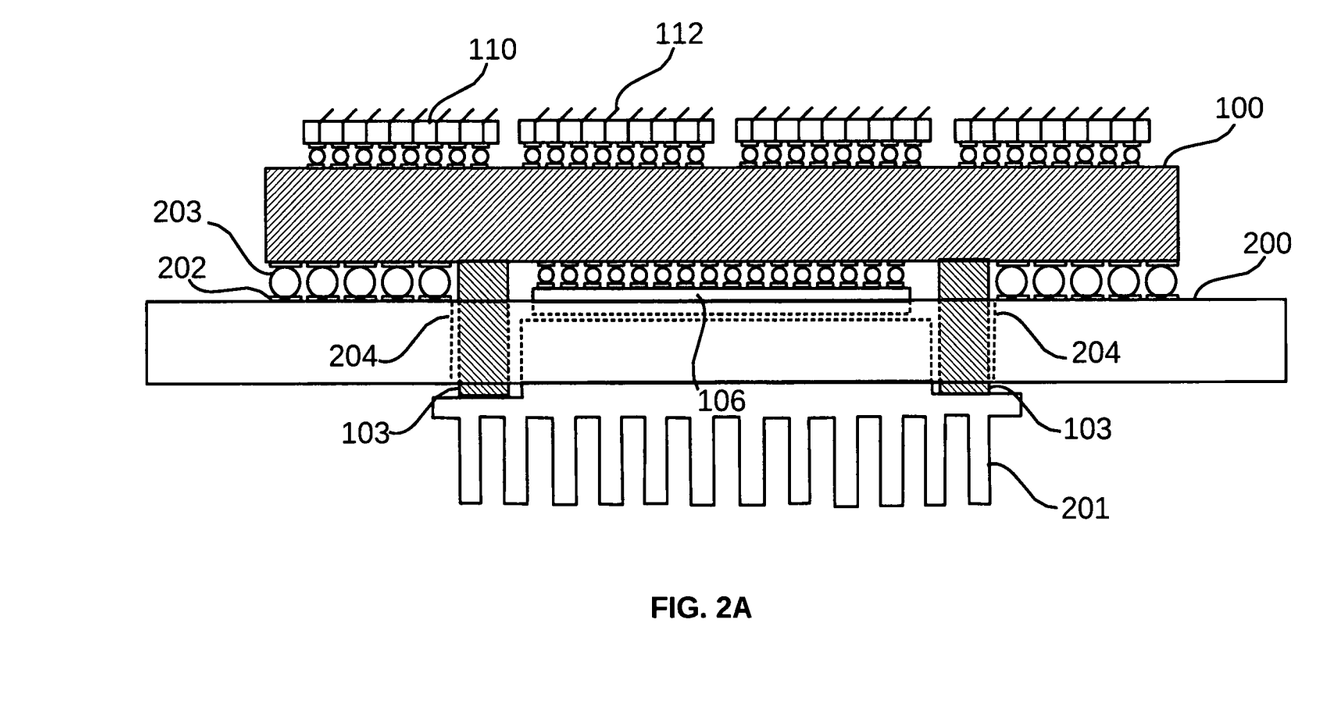
FIG. 2A is the co-packaged substrate assembly with BGA attached to the host PCB, in accordance with the embodiment of the disclosure.

FIG. 2A is a partial cross section view of the co-packaged substrate assembly 100 attached to the host or linecard printed circuit board (PCB) 200 having contacts 202, the package stiffeners extend through host PCB 200 with openings 204 to support application specific integrated circuit (ASIC) heat sink 201.

Figure 2B:
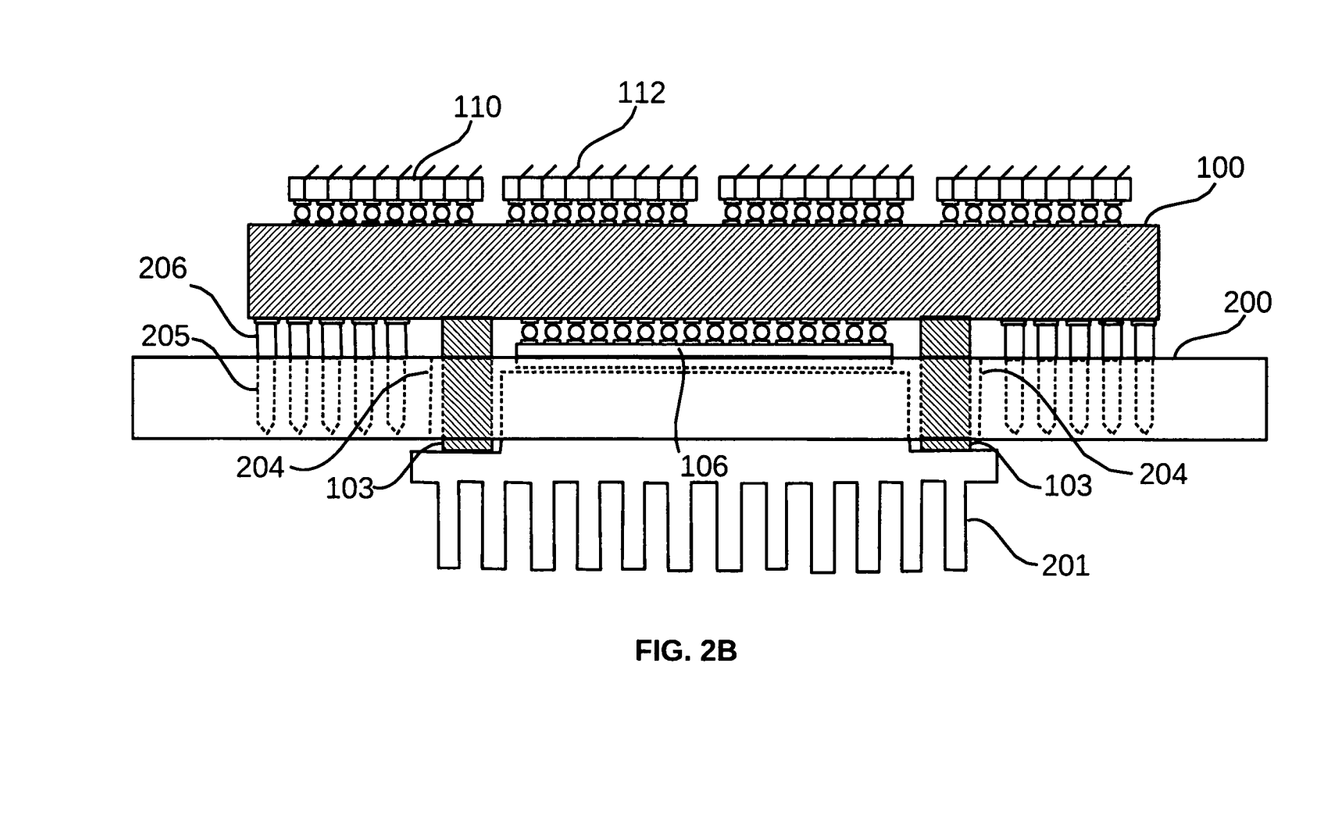
FIG. 2B is the co-packaged substrate assembly with PGA inserted into the host PCB, in accordance with the embodiment of the disclosure.

FIG. 2B is a partial cross section view of the package assembly 100 attached to the host or linecard printed circuit board (PCB) 200 having contacts 202, the package stiffeners extend through host PCB 200 with openings 204 to support application specific integrated circuit (ASIC) heat sink 201.

FIG. 2B is an alternate embodiment of FIG. 2A, showing a partial cross section view of co-packaged substrate assembly 100 inserted into the host or linecard printed circuit board (PCB) 200 having pin grid array (PGA) sockets 205, the package stiffeners extend through the host or linecard PCB 200 with openings 204 to support large application specific integrated circuit (ASIC) heat sink 201.

Figure 3A:
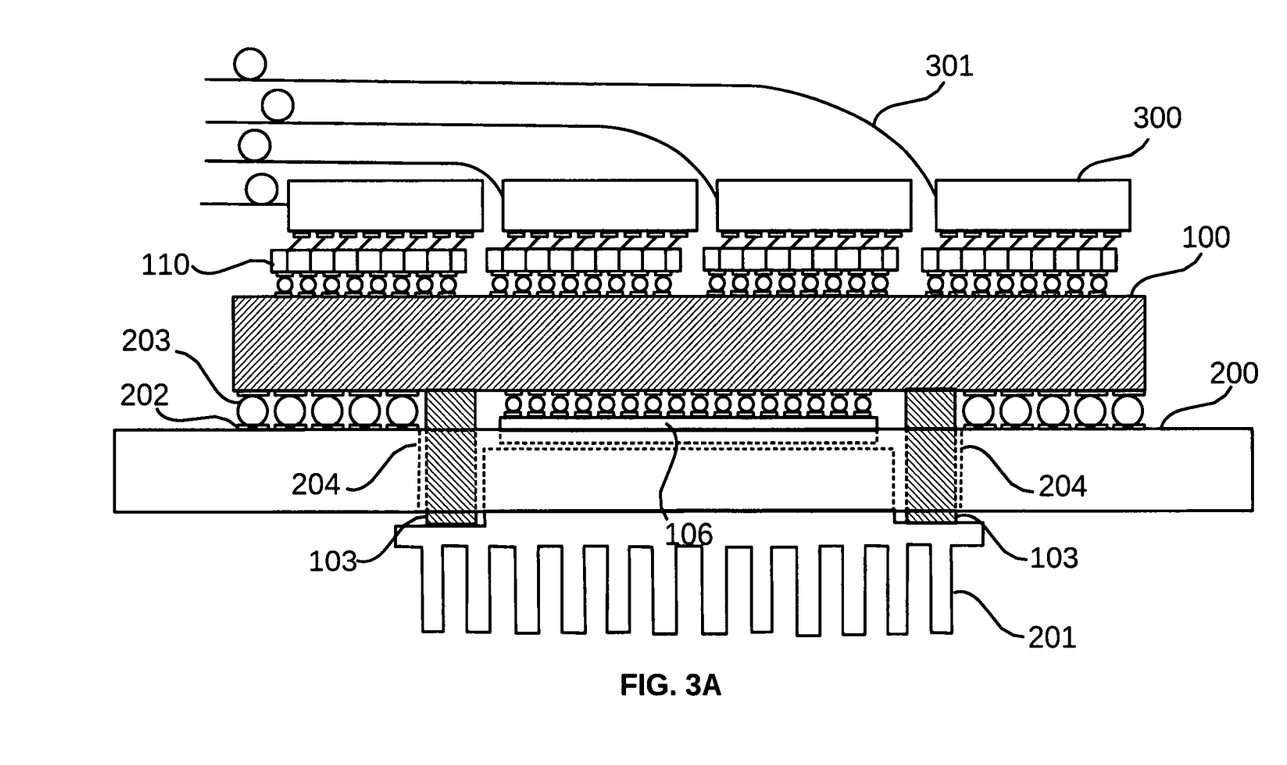
FIG. 3A is the substrate assembly attached to host PCB with BGA and several PICs socketed on top of the substrate, in accordance with the embodiment of the disclosure.

FIG. 3A is a partial cross section view of co-packaged substrate assembly 100 with application specific integrated circuit (ASIC) attached to the host linecard printed circuit board (PCB) 200 with ball grid array (BGA) 203 attachment, optoelectronics or photonic integrated circuit (PIC) units 300 assembled via socket 110 onto the substrate package assembly 100, each optoelectronic or photonic integrated circuit (PIC) has an optical fiber cable or optical fiber ribbon 301 for ingress/egress traffic. ASIC 106 expected to dissipate a very high amount of power. The embodied co-packaged assembly 100 is inserted into PCB opening 204 and stiffener 103 to mechanically support the heat sink 201 mounted from bottom of host or lincard PCB 200. The host PCB 200 thermally isolate the sensitive optoelectronic or PIC units that are mounted on top of substrate assembly 100. The large heat sinks 201 mounted from bottom side of host or linecard PCB 200 also eliminate potential obstructions or interference with optical fibers or optical fiber ribbons. With heat sinks 201 mounted from bottom of the host or linecard PCB 200 and not obstructing optoelectronics devices or PIC units 300, it is technically feasible to service or replace optoelectronics devices or PIC units 300 while the system is operating.

Figure 3B:
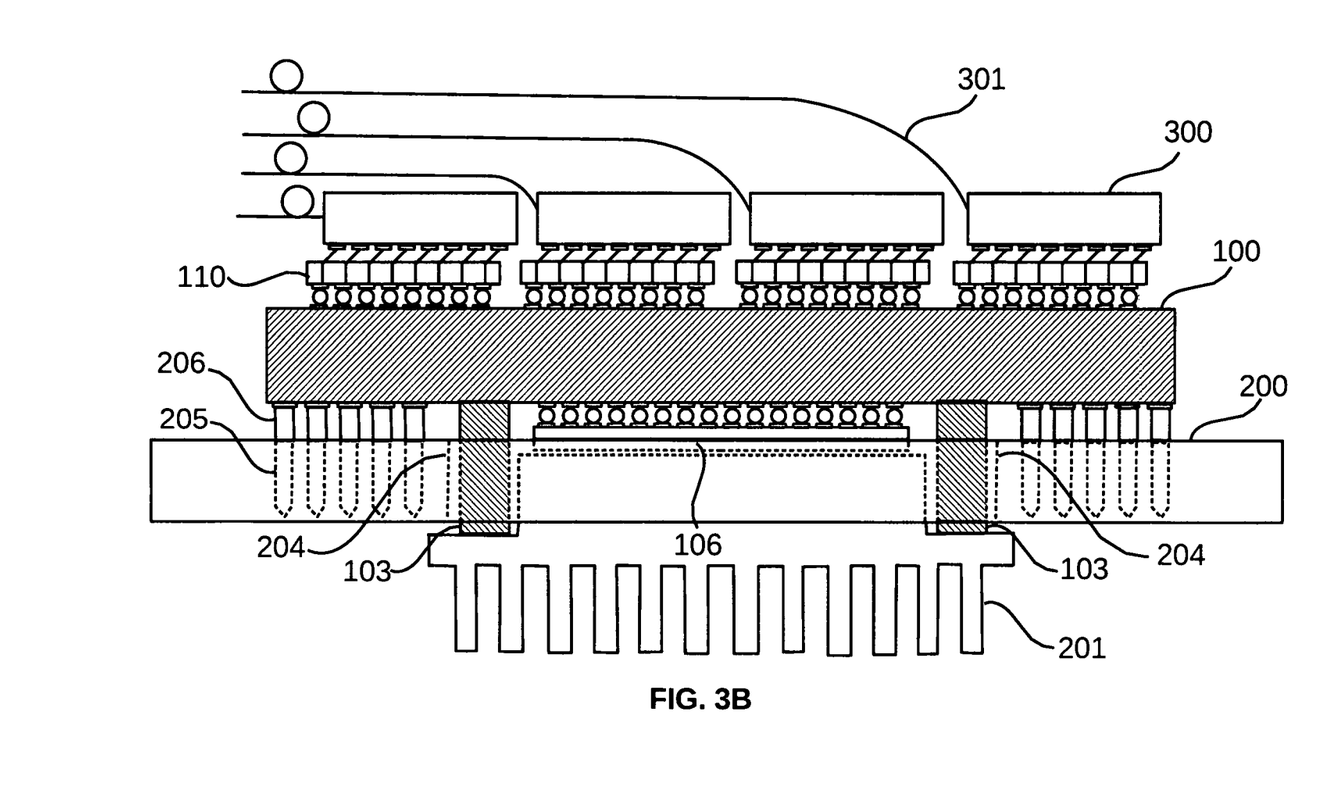
FIG. 3B is the substrate assembly attached to host PCB with PGA and several PICs socketed on top of the substrate, in accordance with the embodiment of the disclosure.

FIG. 3B is an alternate embodiment of FIG. 3A, showing a partial cross section view of co-packaged substrate assembly 100 with application specific integrated circuit (ASIC) inserted into the host or linecard printed circuit board (PCB) 200 with pin grid array (PGA) 206 attachment, optoelectronics device or photonic integrated circuit (PIC) units 300 assembled via socket 110 on to the package assembly 100, each optoelectronics or PIC unit has an optical fiber cable or optical fiber ribbon 301 for ingress/egress traffic.

Figure 3C:
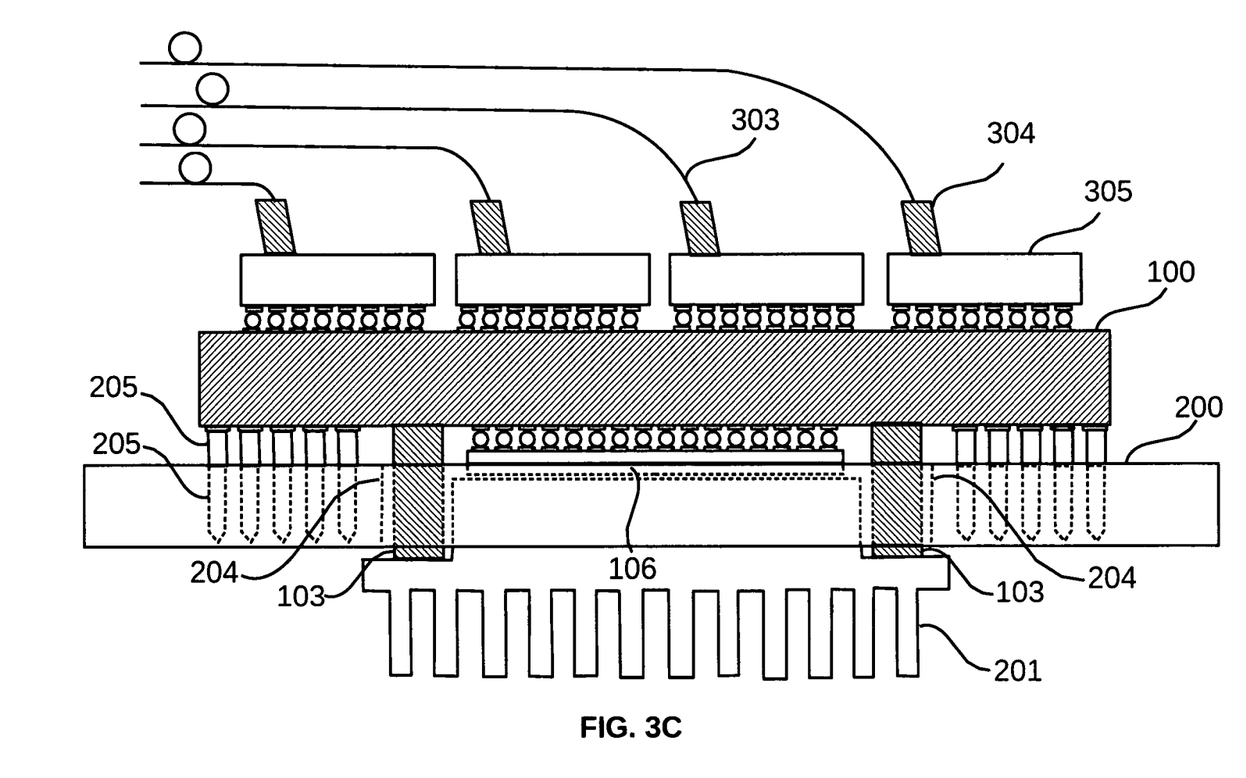
FIG. 3C is the substrate assembly attached to host PCB with PGA and several PICs mounted on top of the substrate with BGA contacts, in accordance with the embodiment of the disclosure.

FIG. 3C is an alternate embodiment of FIG. 3A, showing a partial cross section view of co-packaged substrate assembly 100 with application specific integrated circuit (ASIC) inserted into the host or linecard printed circuit board PCB 200 with pin grid array (PGA) 206 attachment, this embodiment of the optoelectronics device or photonic integrated circuit (PIC) units 305 uses direct ball grid array (BGA) attachment of the optoelectronic device or PIC onto the package assembly 100. This embodiment uses vertical fiber couplers 304 without any interference from heatsink 201, each optoelectronic device or PIC unit has an optical fiber cable or optical fiber ribbon 303 for ingress/egress traffic.

Figure 3D:
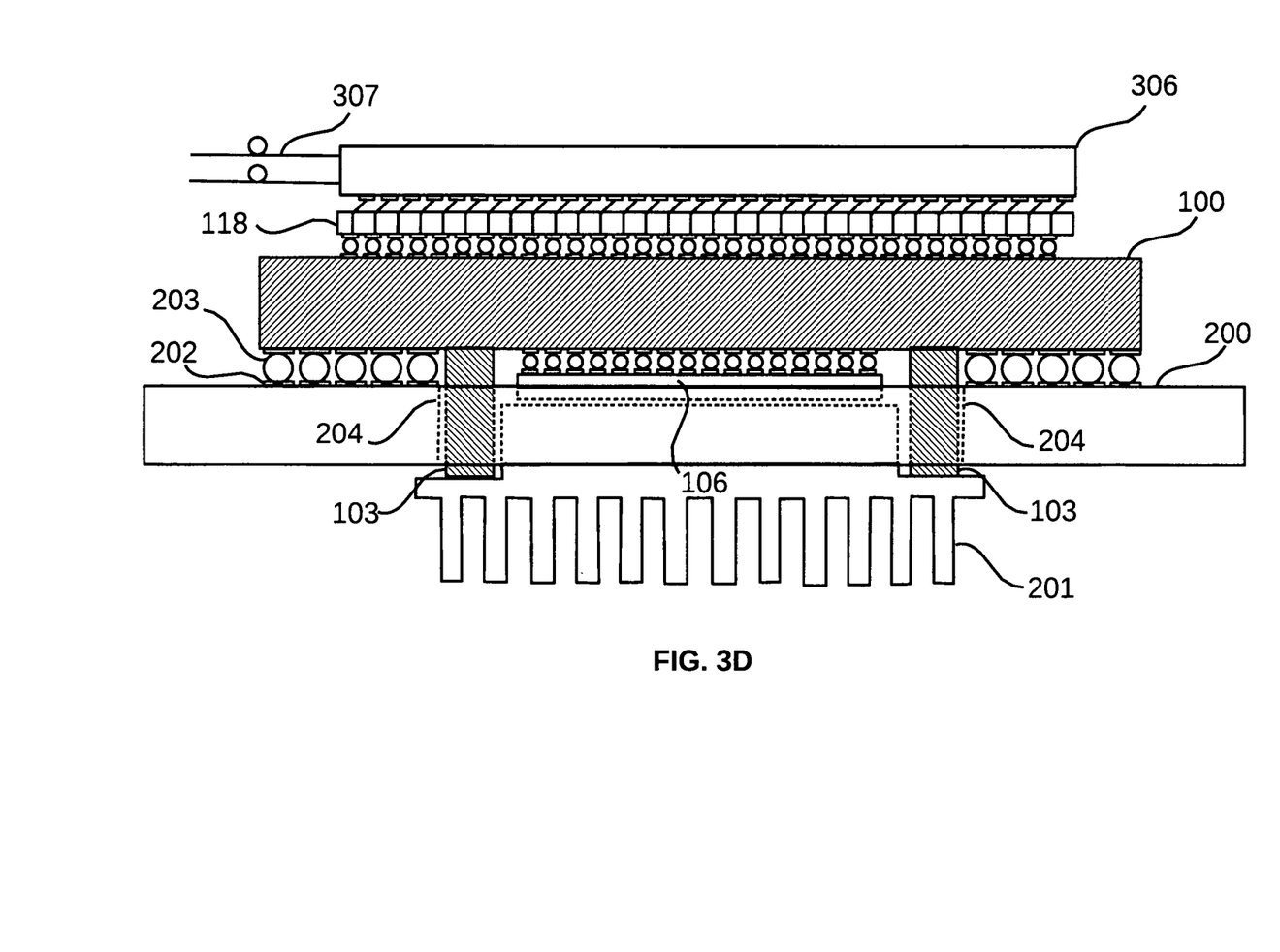
FIG. 3D is the substrate assembly attached to host PCB with BGA and one large PICs socketed on top of the substrate, in accordance with the embodiment of the disclosure.

FIG. 3D is an alternate embodiment of FIG. 3A FIG, showing a partial cross section view of co-packaged substrate assembly 100 with application specific integrated circuit (ASIC) 106 attached to the host or linecard printed circuit board (PCB) 200 with ball grid array (BGA) 203, this embodiment of the optoelectronic device or photonic integrated circuit (PIC) 306 is based on one large unit assembled via one large socket 118 onto the package assembly 100, each optoelectronic device or PIC unit has an optical fiber cable or optical fiber ribbon 306 for ingress/egress traffic.

Figure 3E:
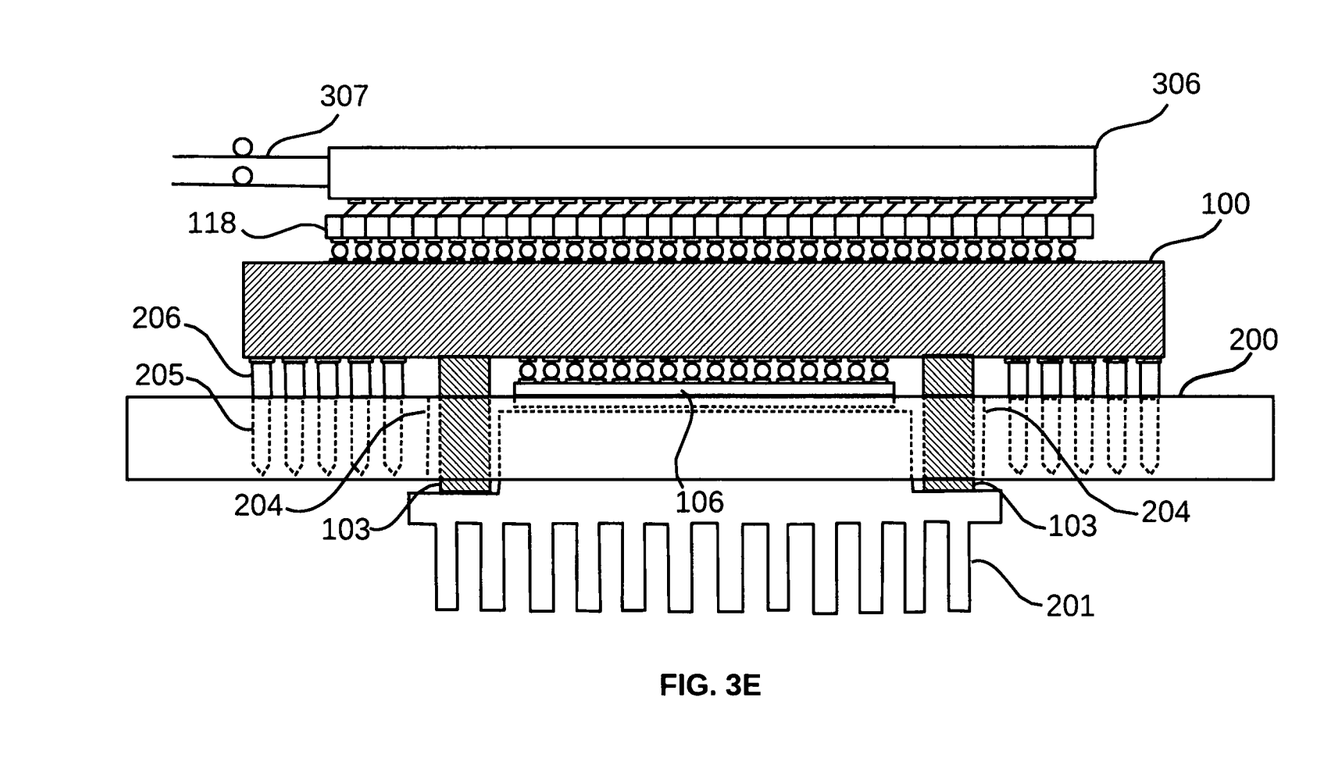
FIG. 3E is the substrate assembly attached to host PCB with PGA and one large PIC socketed on top of the substrate, in accordance with the embodiment of the disclosure.

FIG. 3E is an alternate embodiment of FIG. 3A, showing a partial cross section view of co-packaged substrate assembly 100 with application specific integrated circuit (ASIC) 106 inserted into the host or linecard printed circuit board (PCB) 200 with pin grid array (PGA) 206 pins, this embodiment of the optoelectronics or photonic integrated circuit (PIC) 306 is a single large unit, assembled via one large socket 113 onto the package assembly 100, each optoelectronics or PIC unit has an optical fiber cable or optical fiber ribbon 307 for ingress/egress traffic.

The invention claimed is:

1. A method of co-packaging photonics integrated circuits (PICs) on at least one integrated optics system substrate assembly (IOSSA) that provides in-package optical input/output (IO) and a package substrate for application specific integrated circuits (ASICs), graphic processor unit (GPU), CPU, or field programmable gate array (FPGA) which are integrated into a host or linecard printed circuit board (PCB) the method comprising:
co-packaging each IOSSA with data processing, accelerators, switching, memory, and data storage applications that provide high speed optical communication;
providing an IOSSA package substrate with metallization and micro-bumps or Cu pillars for attaching ASICs, GPU, CPU, or FPGA die on one side of the IOSSA package substrate and attaching the PICs to the opposite side of the IOSSA package substrate
wherein a plurality of the IOSSAs are mounted on the host or linecard PCB with a cutout in the PCB for the ASIC, GPU, or FPGA; and
wherein the cutout further provides for passage of an IOSSA package substrate stiffener and the host or linecard PCB provides thermal isolation between the top and bottom of each IOSSA.

2. The method according to claim 1, further comprising a stiffener attached on the same side as ASIC, GPU, CPU, or FPGA; wherein the stiffener provides for rigidity of the package substrate and heat sink attachment.

3. The method according to claim 1, wherein the IOSSA has a ball grid array (BGA) at either the top or bottom of the substrate.

4. The method according to claim 1, further providing a pin grid array (PGA) wherein pins are provided on the same side of the IOSSA as the ASIC, GPU, CPU, or FPGA for attachment to host PCB.

5. The method according to claim 1, further providing one or more BGA or LGA sockets attached on top or bottom of IOSSA and on the opposite side as ASIC, GPU, CPU, or FPGA.

6. The method according to claim 1, wherein the photonic integrated circuits (PIC) providing high density and high capacity optical 10 are mounted on top side of package substrate and ASIC/GPU/FPGA/CPU are mounted on the bottom side of the IOSSA.

7. The method according to claim 1, wherein the photonic integrated circuits (PICs) and ASIC/GPU/FPGA/CPU are mounted on both sides of the IOSSA package substrate creating a 3D substrate assembly and reducing a package size and trace lengths.

8. A system for communication or computing comprising:
a co-packaged integrated optics system substrate assembly (IOSSA) comprising:
an ASIC, GPU, CPU, or FPGA die directly attached to the bottom side of a package substrate;
optoelectronics components (OCs) or a photonic integrated circuit (PIC) mounted by means of BGA connections wherein the BGA connections are attached to the top surface of the package substrate;

the PIC or OCs convert ASIC, GPU, CPU, or FPGA electrical signals into optical signals;

an optical fiber or an optical ribbon, via an optical input/output (IO) on the PIC/OCs, that transports modulated optical signal data originating from electrical signals of said ASIC, GPU, CPU, or FPGA of said co-packaged IOSSA to PIC/OCs of another co-packaged IOSSA; wherein said PIC/OCs of another co-packaged IOSSA convert said modulated optical signal data to electrical signals for an ASIC, GPU, CPU, or FPGA of the said other co-packaged IOSSA; and wherein the co-packaged IOSSA and ASIC, GPU, CPU, or FPGA is mounted on a host or linecard PCB with a cutout for the ASIC, GPU, CPU, or FPGA.

9. The system according to claim 8, wherein the IOSSA substrate assembly with ball grid array (BGA) pads are on top/bottom of the IOSSA assembly.

10. The system according to claim 8, wherein optoelectronics devices or photonic integrated circuits (PICs) are mounted on the IOSSA, the IOSSA substrate electrically connects PIC to the ASIC, GPU, CPU, or FPGA through the ball grid array (BGA) or land grid array (LGA) sockets.

11. The system according to claim 8, wherein the top and bottom surface of the IOSSA mounted on the host PCB with a cutout provide thermal and liquid isolation between top and bottom of IOSSA.

12. The system according to claim 10, wherein the IOSSA mounted on a host PCB the ASIC, GPU, CPU, or FPGA are mounted on the host or linecard PCB with a cut-out may include a stiffener.

13. The system according to claim 12, wherein optical fiber or optical ribbons are attached to the optoelectronics devices or photonic integrated circuits (PCs).

14. The system according to claim 9, wherein ball grid arrays (BGAs) or micro ball grid arrays (p-BGAs) can be placed on top and bottom side of IOSSA assembly.

15. The system according to claim 9, wherein a stiffener is attached to the package substrate.

16. The system according to claim 9, wherein ball grid array (BGA) or land grid array (LGA) sockets are attached to the package substrate.

17. The system according to claim 12, wherein heat sink is mounted through the PCB cutout onto the ASIC and secured by the stiffener.

* * * * *